(12) United States Patent
Bour et al.

(10) Patent No.: US 9,136,116 B2
(45) Date of Patent: Sep. 15, 2015

(54) METHOD AND SYSTEM FOR FORMATION OF P-N JUNCTIONS IN GALLIUM NITRIDE BASED ELECTRONICS

(75) Inventors: David P. Bour, Cupertino, CA (US); Thomas R. Prunty, Santa Clara, CA (US); Linda Romano, Sunnyvale, CA (US); Andrew P. Edwards, San Jose, CA (US); Isik C. Kizilyalli, San Francisco, CA (US); Hui Nie, Cupertino, CA (US); Richard J. Brown, Los Gatos, CA (US); Mahdan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 229 days.

(21) Appl. No.: 13/198,666

(22) Filed: Aug. 4, 2011

(65) Prior Publication Data
US 2013/0032814 A1 Feb. 7, 2013

(51) Int. Cl.
| | |
|---|---|
| H01L 21/20 | (2006.01) |
| H01L 21/02 | (2006.01) |
| H01L 29/66 | (2006.01) |
| H01L 29/861 | (2006.01) |
| H01L 29/808 | (2006.01) |
| H01L 29/20 | (2006.01) |

(52) U.S. Cl.
CPC ...... *H01L 21/02579* (2013.01); *H01L 21/0254* (2013.01); *H01L 21/02639* (2013.01); *H01L 21/02647* (2013.01); *H01L 29/66204* (2013.01); *H01L 29/8611* (2013.01); *H01L 29/2003* (2013.01); *H01L 29/8083* (2013.01)

(58) Field of Classification Search
CPC ............ H01L 29/1608; H01L 29/2003; H01L 29/66462; H01L 29/66924; H01L 29/7787; H01L 27/0605; H01L 21/0254; H01L 21/8252; H01L 21/02636–21/02653; H01L 21/02573–21/02579
USPC ............... 257/183–201, 76, 77; 438/542–569
See application file for complete search history.

(56) References Cited

U.S. PATENT DOCUMENTS

| | | | | |
|---|---|---|---|---|
| 4,262,296 | A * | 4/1981 | Shealy et al. | 257/267 |
| 4,587,712 | A * | 5/1986 | Baliga | 438/137 |
| 7,109,100 | B2 * | 9/2006 | Nakamura | 438/559 |
| 7,355,223 | B2 * | 4/2008 | Harris et al. | 257/256 |
| 7,592,647 | B2 * | 9/2009 | Nakata et al. | 257/194 |
| 7,863,649 | B2 * | 1/2011 | Hikita et al. | 257/194 |
| 8,466,017 | B2 * | 6/2013 | Sheridan et al. | 438/192 |
| 2002/0003245 | A1 * | 1/2002 | Kato et al. | 257/279 |
| 2009/0267078 | A1 * | 10/2009 | Mishra et al. | 257/76 |
| 2009/0269896 | A1 * | 10/2009 | Chen et al. | 438/271 |
| 2010/0025730 | A1 * | 2/2010 | Heikman et al. | 257/194 |
| 2010/0124814 | A1 * | 5/2010 | Arena | 438/504 |
| 2010/0148186 | A1 * | 6/2010 | Sheridan et al. | 257/77 |
| 2011/0133212 | A1 * | 6/2011 | Sheridan et al. | 257/77 |
| 2011/0210377 | A1 * | 9/2011 | Haeberlen et al. | 257/194 |
| 2013/0032811 | A1 * | 2/2013 | Kizilyalli et al. | 257/76 |
| 2013/0153963 | A1 * | 6/2013 | Shealy et al. | 257/190 |
| 2014/0045306 | A1 * | 2/2014 | Bour et al. | 438/192 |

\* cited by examiner

*Primary Examiner* — Steven J Fulk
*Assistant Examiner* — Eric Ward
(74) *Attorney, Agent, or Firm* — Kilpatrick Townsend & Stockton LLP

(57) ABSTRACT

A semiconductor device includes a III-nitride substrate having a first conductivity type and a first electrode electrically coupled to the III-nitride substrate. The semiconductor device also includes a III-nitride material having a second conductivity type coupled to the III-nitride substrate at a regrowth interface and a p-n junction disposed between the III-nitride substrate and the regrowth interface.

15 Claims, 9 Drawing Sheets

METHOD AND SYSTEM FOR FORMATION OF P-N JUNCTIONS IN GALLIUM NITRIDE BASED ELECTRONICS

CROSS-REFERENCES TO RELATED APPLICATIONS

The following regular U.S. patent applications (including this one) are being filed concurrently, and the entire disclosure of the other applications are incorporated by reference into this application for all purposes:

Application Ser. No. 13/198,655, filed Aug. 4, 2011, entitled "METHOD AND SYSTEM FOR GAN VERTICAL JFET UTILIZING A REGROWN GATE";

Application Ser. No. 13/198,659, filed Aug. 4, 2011, entitled "METHOD AND SYSTEM FOR A GAN VERTICAL JFET UTILIZING A REGROWN CHANNEL"; and Application Ser. No. 13/198,666, filed Aug. 4, 2011, entitled "METHOD AND SYSTEM FOR FORMATION OF P-N JUNCTIONS IN GALLIUM NITRIDE BASED ELECTRONICS".

BACKGROUND OF THE INVENTION

Power electronics are widely used in a variety of applications. Power electronic devices are commonly used to modify a form of electrical energy, for example, voltage or current converters. Such converters can operate over a wide range of power levels, from milliwatts in mobile devices to hundreds of megawatts in a high voltage power transmission system). Despite the progress made in power electronics, there is a need in the art for improved electronics systems and methods of operating the same.

SUMMARY OF THE INVENTION

The present invention relates generally to electronic devices. More specifically, the present invention relates to methods and systems for forming p-n junctions in III-V material systems. Merely by way of example, the invention has been applied to methods and systems for displacing a p-n junction from a regrowth interface in a III-nitride based semiconductor device. The methods and techniques can be applied to a variety of compound semiconductor systems including transistors, diodes, and other electronic and optoelectronic devices.

According to an embodiment of the present invention, a semiconductor device is provided. The semiconductor device includes a III-nitride substrate having a first conductivity type and a first electrode electrically coupled to the III-nitride substrate. The semiconductor device also includes a III-nitride material having a second conductivity type coupled to the III-nitride substrate at a regrowth interface and a p-n junction disposed between the III-nitride substrate and the regrowth interface.

According to another embodiment of the present invention, a method of forming a lateral p-n junction in III-nitride materials is provided. The method includes providing an n-type III-nitride substrate and forming an n-type epitaxial layer coupled to the n-type III-nitride substrate. The method also includes removing at least a portion of the n-type epitaxial layer to define an n-type structure and diffusing an acceptor into a predetermined portion of the n-type epitaxial structure. The method further includes regrowing a p-type epitaxial layer electrically coupled to the predetermined portion of the n-type epitaxial structure.

According to a specific embodiment of the present invention, a method of fabricating a lateral p-n junction is provided. The method includes providing a III-nitride substrate having a first conductivity type and forming a diffusion mask over a predetermined portion of the III-nitride substrate. The method also includes forming a dopant source including a dopant in contact with at least an exposed portion of the III-nitride substrate and diffusing the dopant into the III-nitride substrate to form a diffusion region having a second conductivity type different from the first conductivity type.

According to another specific embodiment of the present invention, a method of forming a lateral p-n junction is provided. The method includes providing a substrate comprising a GaN-based material characterized by a first conductivity type and forming a masking layer on a surface of the substrate. The method also includes removing a predetermined portion of the substrate using an ex-situ etch process and removing an additional predetermined portion of the substrate using an in-situ etch process. The method further includes regrowing a GaN-based material characterized by a second conductivity type in at least a portion of the predetermined portion and the additional predetermined portion of the substrate.

Numerous benefits are achieved by way of the present invention over conventional techniques. For example, embodiments of the present invention provide improved p-n junction quality with reduced leakage current or other current-voltage (I-V) characteristics in comparison with conventional techniques. Some embodiments provide a p-n junction region characterized by a reduced number of structural defects resulting, for example, from etching damage, chemical contamination, exposure to air, or the like. Embodiments of the present invention provide devices with reduced Shockley-Read-Hall recombination at the junction, thereby reducing leakage current in response to application of a bias voltage. In some implementations, the quality of the p-n junction is comparable to that of a p-n junction formed by a continuous growth process. These and other embodiments of the invention along with many of its advantages and features are described in more detail in conjunction with the text below and attached figures.

DETAILED DESCRIPTION OF SPECIFIC EMBODIMENTS

Embodiments of the present invention relate to electronic devices. More specifically, the present invention relates to methods and systems for forming p-n junctions in III-V material systems. Merely by way of example, the invention has been applied to methods and systems for displacing a p-n junction from a regrowth interface in a III-nitride based semiconductor device. The methods and techniques can be applied to a variety of compound semiconductor systems including transistors, diodes, and other electronic and optoelectronic devices.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. Many GaN-based devices include planar p-n junctions, typically formed in a single growth step. However, some classes of GaN-based devices incorporate a lateral p-n junction.

Figure 1A:
FIGS. 1A-1F are simplified schematic diagrams illustrating a process flow for formation of a lateral p-n junction.

FIGS. 1A-1F are simplified schematic diagrams illustrating a process flow for formation of a lateral p-n junction. Referring to FIG. 1A, an n-type GaN substrate 101 is provided. As illustrated in FIG. 1A, the substrate is an n-type GaN substrate, but the present invention is not limited to this particular material. In some embodiments, substrates with p-type doping are utilized.

Figure 1B:
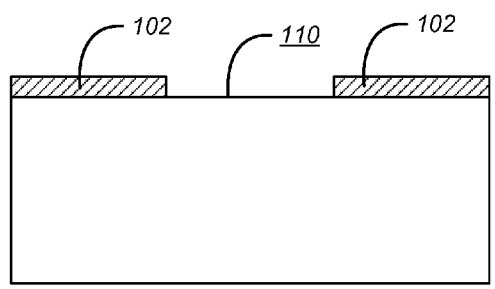

Referring to FIG. 1B, an etch/regrowth mask 102 is formed adjacent a surface 110 of the substrate 101. In some embodiments, the etch/regrowth mask can be applied over adhesion layers or the like as part of a deposition and patterning process. One of ordinary skill in the art would recognize many variations, modifications, and alternatives. The etch/regrowth mask can be fabricated using a variety of materials including dielectrics such as oxides and nitrides or other suitable materials that can be deposited, patterned, withstand etching processes, withstand high temperature regrowth processes, and be removed after processing.

Figure 1C:
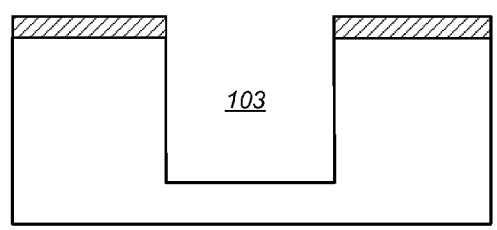
Figure 1D:
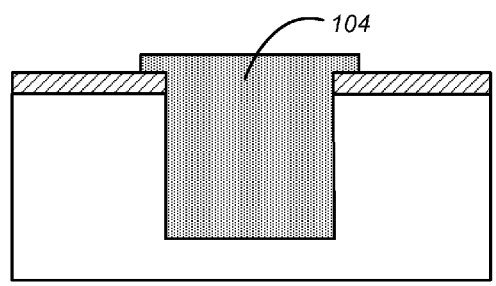

As illustrated in FIG. 1C, a recessed region 103 is etched in the substrate 101 to form a trench in the illustrated embodiment. The shape of the recessed region 103 is a function of the particular devices to be fabricated, details of the etching process, and will vary depending on the particular application. Although a trench is illustrated in FIG. 1C, embodiments of the present invention are not limited to this particular shape and other shapes can be employed. As illustrated in FIG. 1C, the etch process is a substantially anisotropic etch with little to no undercutting under the etch/regrowth mask 102. In other embodiments, some undercutting associated with an isotropic etch component can be observed. Isotropic etching is a viable process for some embodiments of the present invention. A selective regrowth process is used (FIG. 1D) to form a regrown region 104 in the recessed region 103 and, in the illustrated embodiment, over a portion of the etch/regrowth mask 102. The regrowth process can provide a p-type material in contact with an n-type material as well as an n-type material in contact with a p-type material.

Figure 1E:
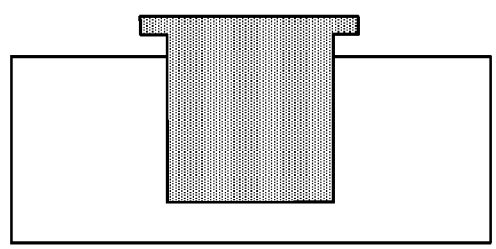
Figure 1F:
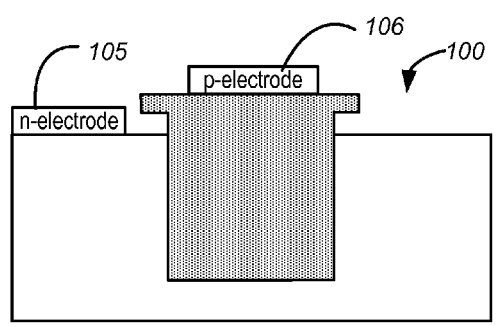

The etch/regrowth mask 102 is removed as illustrated in FIG. 1E and electrodes 105/106 are formed in electrical contact with the substrate 101 and the regrown region 104. Various materials including metals and metal alloys can be used to fabricate the illustrated electrodes. An electrode on the p-type region is not present in all embodiments, for example, when the p-type region forms a passive guard ring surrounding the Schottky metal contact of a Schottky barrier diode. In FIG. 1F, an n-electrode 105 and a p-electrode 106 are illustrated, but the conductivity type can be modified as appropriate to the particular application.

The device 100 illustrated in FIG. 1F provides a lateral p-n junction formed between the bulk material of the n-type substrate 101 and the regrown material in regrown region 104. The lateral p-n junction includes depletion regions with a generally vertical orientation that are orthogonal to surface 119 of the substrate. Thus, the term "lateral junction" or "lateral p-n junction" indicates current flow in a lateral direction across the junction. Although this orientation is illustrated in FIG. 1F, other embodiments can utilize different geometries as appropriate to the particular implementation. One of ordinary skill in the art would recognize many variations, modifications, and alternatives.

Figure 2A:
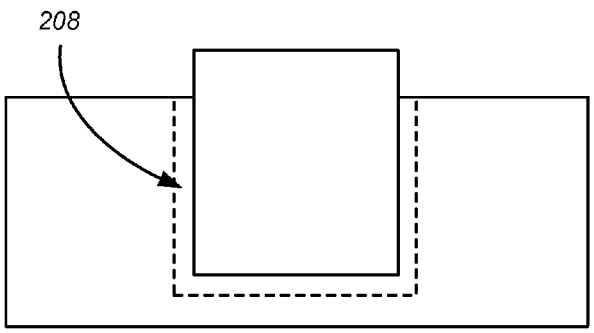
FIGS. 2A-2B are simplified schematic diagrams illustrating epitaxial regrowth and p-n junction formation.
Figure 2B:
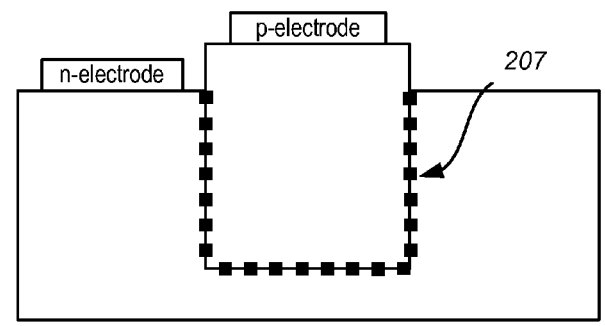

FIGS. 2A-2B are simplified schematic diagrams illustrating epitaxial regrowth and p-n junction formation. Referring to FIG. 2A, a region 208 characterized by chemical contamination, structural damage, or the like and generally associated with the etch and regrowth process used to form the lateral p-n junction is present in the structure. The lateral and vertical extent of the region 208 associated with chemical contamination and/or structural damage will be a function of the processes used to remove the material from the recessed region and the regrowth processes. This region 208 is schematically illustrated in FIG. 2A and may extend approximately 0.2 µm into the bulk of the substrate.

Referring to FIG. 2B, the center of the lateral p-n junction is illustrated by the defect states 207, but one of skill in the art will appreciate that this illustration of the junction and defect states is merely provided in a schematic manner.

Figure 2C:
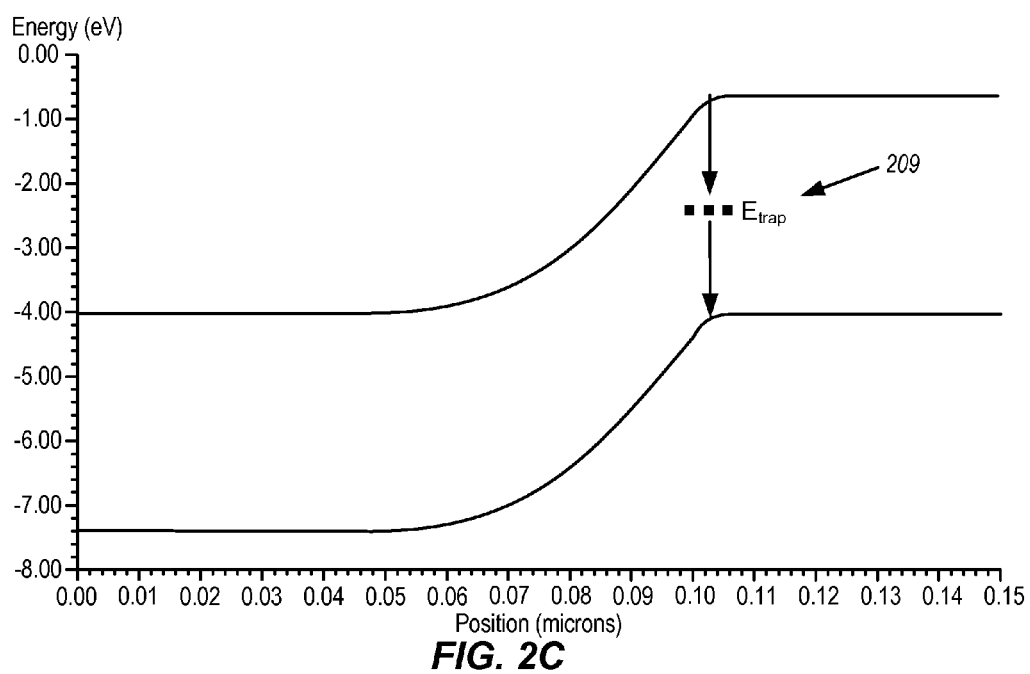
FIG. 2C is a simplified plot illustrating energy bandgap as a function of lateral position for the p-n junction illustrated in FIG. 2B.

FIG. 2C is a simplified plot illustrating energy bandgap as a function of lateral position for the p-n junction illustrated in FIG. 2B. As illustrated in FIG. 2C, mid-gap defect states ($E_{trap}$) 209 are present at the p-n junction as a result of the chemical contamination, structural damage, or the like at the p-n junction. Without limiting the scope of the present invention, the inventors believe that the quality of regrown p-n junctions as illustrated in FIG. 2B is likely to be inferior compared to a more conventional planar p-n junction formed in a continuous epitaxial growth process. Specifically, the junction formed at the initiation of regrowth may be characterized by high leakage currents and other undesirable I-V characteristics because the etched surfaces may be structurally defective or chemically contaminated. In some processes used with III-V materials such as dry etching, damage to the crystal structure occurs during processing. During a dry etch process, damage may occur during etching that is not completely annealed during the regrowth process. Additionally, the etching gases may contaminate the etched surface. Furthermore, exposure to air or other atmospheres after the etching process may introduce a chemical contamination of the etched surfaces. As illustrated in FIG. 2C, mid-gap defect states 209 are introduced as a result of the fabrication process producing structural defects, chemical contamination, or the like. These mid-gap states participate in Shockley-Read-Hall recombination, thereby causing excessive diode leakage current.

As an example, some chemical contamination of the regrowth surface may result from residual contamination from the etch gases used during the etch process, which is typically a reactive ion etching (RIE) process. Additionally, when the material is removed from the etch chamber, oxidation of the surface or adhesion of one or more impurities on the surface can result in chemical contamination of the regrowth interface.

Additionally, the inventors have determined that structural damage may be present at the regrowth interface due, for example, to the fact that GaN-based materials are quite hard and present issues for the etching processes that are commonly used and typically utilize a significant sputtering component. Thus, both chemical contamination and structural damage can be present at the regrowth interface. Regrowth on this type of surface will typically result in the formation of a p-n junction that is characterized by less than optimal electrical characteristics including leakage currents. Without limiting embodiments of the present invention, the inventors believe that mid-gap states result from the chemical contamination and/or structure damage, thereby contributing, in part, to the leakage currents.

According to embodiments of the present invention described throughout the present specification, the junction I-V characteristics are improved by performing an impurity diffusion before the regrowth process. In this manner, the p-n junction is displaced from the regrowth interface. Consequently, the p-n junction is formed in bulk material and spaced a predetermined distance from surfaces that have been rendered imperfect by, for example, structural damage, chemical contamination, or the like. Thus, embodiments of the present invention provide p-n junctions that have diode I-V characteristics that are improved in comparison with conventional techniques.

Embodiments of the present invention provide methods and systems in which an improved surface characterized by high interface quality is provided for a p-n junction, for example, by moving the p-n junction into bulk material through a diffusion process or, for example, by forming a new surface associated with the p-n junction using an etching process. Additional description of these methods and techniques is provided throughout the specification and more particularly below.

As described more fully throughout the present specification, a diffusion process can be utilized prior to regrowth to shift the location of the p-n junction away from the regrowth interface and into the bulk of the substrate. In some embodiments, zinc, which is a deep acceptor, with activation energy in the range 400-500 meV, will compensate for the n-type doping of the substrate and shift the p-n junction from the etched surface to the pristine bulk material. In some embodiments, lateral p-n junctions are formed by zinc diffusion, which is not obvious for III-nitride systems as a result of the deep acceptor characteristics of zinc diffused in such materials including GaN. Utilizing embodiments of the present invention, there are fewer structural defects from etching processes and/or chemical contamination from etching/air-exposure in the vicinity of the p-n junction. This reduces SRH recombination at the junction, which is responsible for leakage current when bias voltage is applied.

Figure 3A:
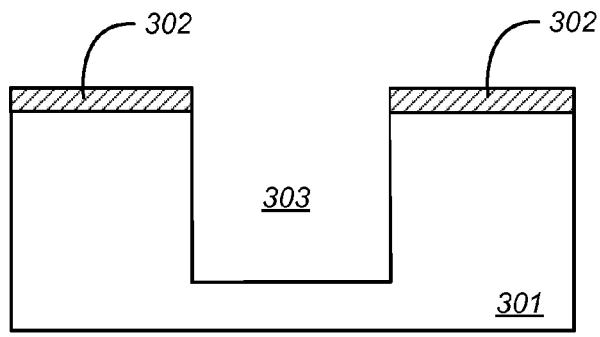
FIGS. 3A-3D are simplified schematic diagrams illustrating a process flow for formation of a lateral p-n junction displaced from a regrowth interface according to an embodiment of the present invention.

FIGS. 3A-3D are simplified schematic diagrams illustrating a process flow for formation of a lateral p-n junction displaced from a regrowth interface according to an embodiment of the present invention. As illustrated in FIG. 3A, an n-type GaN substrate 301 is provided including an etch mask 302, which can be a dielectric etch mask. The etch mask can be a variety of materials that provide resistance to etchant materials including silicon nitride, photoresist, silicon oxide, metal, or the like. In some embodiments, the material used for the etch mask is selected in light of the additional use of the etch mask as a regrowth mask and/or a diffusion mask. An ex-situ etching process is used to form recessed region 303 in a manner similar to the process illustrated in FIG. 1C.

Although the substrate 301 is illustrated as a single material, multiple materials in one or more layers can be included in the term substrate. Additionally, although a GaN substrate is illustrated in FIG. 3A, embodiments of the present invention are not limited to GaN substrates and other III-V materials, in particular, III-nitride materials, are included within the scope of the present invention. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention. Moreover, in some embodiments, the methods and systems described herein are applicable to a variety of material systems, including $Al_2O_3$, SiC, Si, multi-layer substrates such as silicon-on-insulator (SOI), SiC-on-insulator, and the like can be utilized.

Figure 3B:
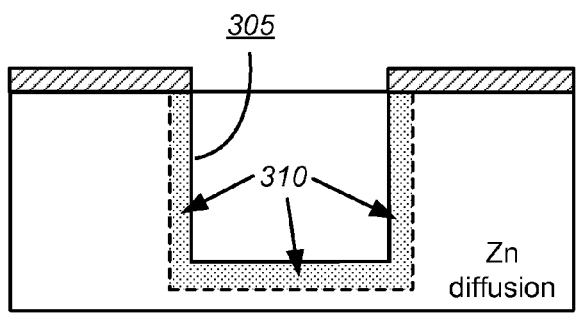

Prior to the selective regrowth process, a diffusion process is performed to diffuse a dopant with a different conductivity type than the substrate into the bulk of the substrate material. Referring to FIG. 3B, a diffusion process, for example, using a zinc source, is performed to form diffused region 310 in the vicinity of the etch interface 305. The depth of the diffused region 310 is selected depending on the particular device and the region associated with chemical contamination, etch damage, or the like. In the illustrated embodiment, an acceptor is diffused into an n-type substrate (i.e., into the material adjacent the regrowth interface 305) to displace the p-n junction formed after regrowth into the bulk of the substrate material to a position interior to the regrowth interface. Thus, the p-n junction is formed in the bulk (interior to the regrowth interface) and not at the regrowth interface. By converting the regrowth interface 305, which may be associated with a contaminated and damaged interface into p-type material, the p-n junction is formed in the bulk (a region characterized by reduced chemical contamination and structural damage in comparison with the regrowth interface) using this diffusion-based technique. Referring to FIG. 3B, the diffusion of the acceptor drives the p-n junction, which would have been located in the vicinity of the regrowth interface, into the bulk. Utilizing the newly positioned p-n junction, the electrical characteristics of the p-n junction are improved in comparison with conventional techniques, represented, for example, by the I-V characteristics.

Embodiments of the present invention utilize one of several techniques to diffuse the donor or acceptor from a variety of sources in one of several manners. The following processes are described for purposes of illustration and are not intended to limit the scope of the present invention. The dopant (e.g., zinc) may be diffused either in-situ or ex-situ from a variety of sources. As an example, the dopant can be provided by a vapor source, such as diethyl- or dimethyl-zinc with ammonia and carrier gases in an MOCVD reactor. Merely by way of example, the device to be diffused could be placed in an open furnace through which the zinc precursor is flowed. As another example, the dopant can be provided by a vapor source in a closed ampoule or boat such as a zinc source that evaporates upon heating to provide a high vapor concentration. The high partial pressure of the dopant would be the driving force for the diffusion process in this example.

As another example, a solid source of the dopant-containing material (e.g., solid zinc or a zinc-containing material such as zinc oxide or the like) could be deposited or otherwise formed on an exposed surface of the device and then used as the dopant source during the diffusion process. In order to prevent evaporation of the dopant-containing source during the diffusion process, the dopant-containing source could be capped with a material having a lower vapor pressure than the dopant-containing material. Examples of materials that could be used as capping materials include dielectric materials such as silicon nitride, silicon oxide, or the like.

The dopant could be zinc itself, or some volatile zinc-containing material such as zinc arsenide, zinc oxide, or the like. In other embodiments, other donors or acceptors can be used during the diffusion process, including, without limitation, compounds including zinc, for instance, diethyl-zinc or dimethyl-zinc discussed above, compounds including magnesium, for example, biscyclopentadienylmagnesium, magnesium-doped SiN, compounds including beryllium, for example diethyl-beryllium or solid beryllium-oxide films, compounds including carbon, for example carbon tetrachloride, carbon tetrabromide, or solid carbon films, combinations thereof, or the like.

Figure 3C:
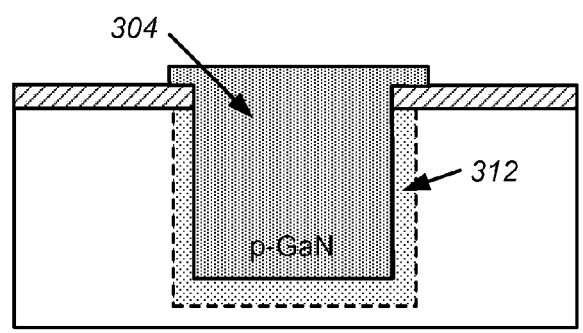
Figure 3D:
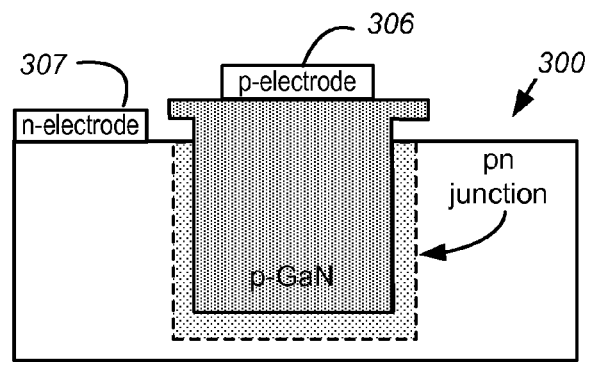

FIG. 3C illustrates the selective regrowth process of a p-type GaN material 304 including some overgrowth of the regrowth mask 302. Other materials in addition to p-type GaN can be regrown as appropriate to the particular application. Referring to FIG. 3D, the dopants in the p-type GaN materials can vary over a range depending on the particular application. In some vertical FET applications, the doping level of the p-type GaN ranges from about $1\times10^{18}$ cm$^{-3}$ to about $1\times10^{20}$ cm$^{-3}$, for example, $1\times10^{19}$ cm$^{-3}$. The dopants in the n-type GaN materials can vary over a range depending on the particular application. In some vertical FET applications, the doping level of the n-type GaN ranges from about $1\times10^{15}$ cm$^{-3}$ to about $1\times10^{18}$ cm$^{-3}$.

Metal electrode regions including one or more metals or metal alloys are formed, using, for example a deposition and patterning process to form the metal electrode contacts 307 to the n-type GaN substrate and the metal electrode contacts 306 to the p-type GaN regrown material. Using the process illustrated in FIGS. 3A-3D, a lateral p-n junction structure with regrown p-type GaN is formed in which the p-n junction is displaced away from regrowth surface by the acceptor impurity diffusion. Thus, the center of the p-n junction is displaced from the regrowth interface with respect to the structure illustrated in FIG. 1F. An electrode on the p-type region is not present in all embodiments, for example when the p-type region forms a passive guard ring surrounding the Schottky metal contact of a Schottky barrier diode.

Referring to FIG. 3C, the p-type portion of the device structure may be referred to as a compound structure since it includes a first portion 312 that is formed by diffusion of acceptors into a previously grown material and a second portion 304 that is grown as a p-type material, for example, the illustrated regrown p-type material. Thus, in this embodiment, a structure is formed in which an n-type material and two or more types of p-type material form a p-n junction. Accordingly, in some embodiments, the p-n junction is displaced from the regrowth interface by a predetermined distance defined, in part, by the diffusion process.

Thus, according to embodiments of the present invention, excessive leakage current associated with the regrown lateral p-n junction is decreased. As illustrated in FIG. 3D, the diffusion of the acceptor impurity into the substrate material displaces the position of the p-n junction into the bulk material and away from the etched surface.

Figure 3E:
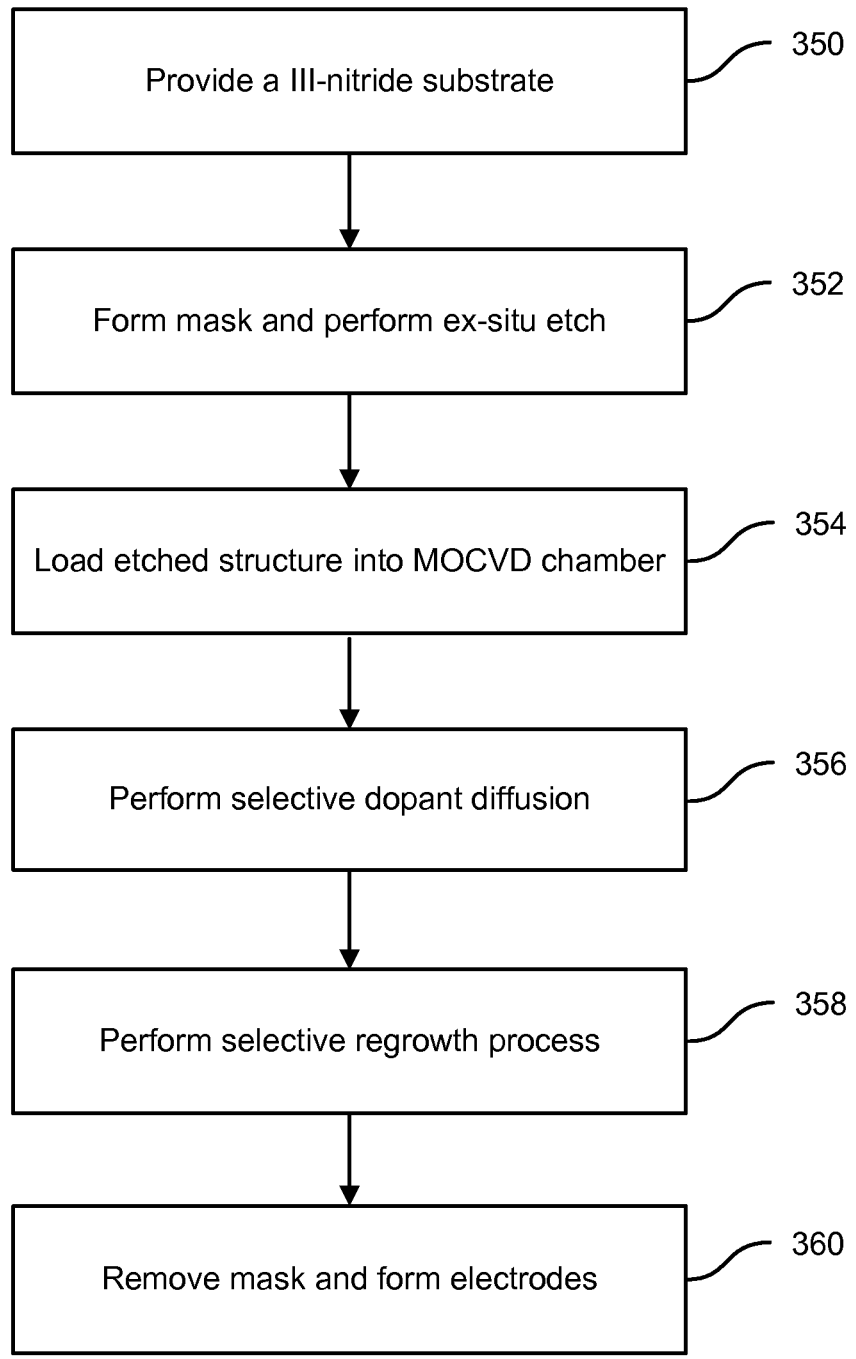
FIG. 3E is a simplified flowchart illustrating a method of fabricating a displaced p-n junction according to an embodiment of the present invention.

FIG. 3E is a simplified flowchart illustrating a method of fabricating a displaced p-n junction according to an embodiment of the present invention. In the embodiment illustrated in FIG. 3E, a lateral p-n junction is formed using an in-situ vapor-diffusion process using a zinc or magnesium precursor containing vapor in an MOCVD reactor. Referring to FIG. 3E, a III-nitride substrate (e.g., an n-type GaN substrate) is provided (350). Although a GaN substrate is illustrated in some embodiments, other III-nitride materials including AlN, InGaN, AlGaN, InAlGaN, doped versions of the same, combinations thereof, and the like, are included within the scope of the present invention. The term substrate includes structures with one or more epitaxial layers formed thereon, substrates fabricating using layer transfer processes, and the like. An etch mask is formed and an ex-situ etch is used to remove a portion of the III-nitride substrate (352). The etch mask can be a multipurpose mask used in not only an etching process, but in a diffusion process as well as a regrowth process. In other embodiments, additional masking layers are utilized to supplement the etch mask or the etch mask can be removed in favor of other masks used in the other various processes described herein. One of ordinary skill in the art would recognize many variations, modifications, and alternatives. The etched structure is loaded into an MOCVD chamber (354).

A selective dopant diffusion (e.g., a zinc diffusion) (356) is performed in the MOCVD chamber using a proper combination of process parameters including pressure, flow (e.g., ammonia, $N_2/H_2$ carriers, dopant precursor such as a diethyl zinc precursor, a dimethyl zinc precursor, a biscyclopentadienylmagnesium precursor, or the like), time, temperature, and the like. In this embodiment, the etch mask also serves as a diffusion mask. A material of a conductivity type opposite to the conductivity type of the III-nitride substrate (e.g., p-type GaN) is selectively grown selectively in the recessed region forming during the etching process (358). The structure is removed from the MOCVD reactor, the mask is removed, and electrodes may be deposited on the p-type and n-type regions (360). An electrode on the p-type region is not present in all embodiments.

Embodiments of the present invention are applicable to a variety of semiconductor devices including electronic/optoelectronic devices including a p-n junction. For example transverse junction (TJ) laser diodes, vertical junction field-effect transistors (VJFETs), and the like.

It should be appreciated that the specific steps illustrated in FIG. 3E provide a particular method of forming a displaced lateral p-n junction according to an embodiment of the present invention. Other sequences of steps may also be performed according to alternative embodiments. For example, alternative embodiments of the present invention may perform the steps outlined above in a different order. Moreover, the individual steps illustrated in FIG. 3E may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4A:
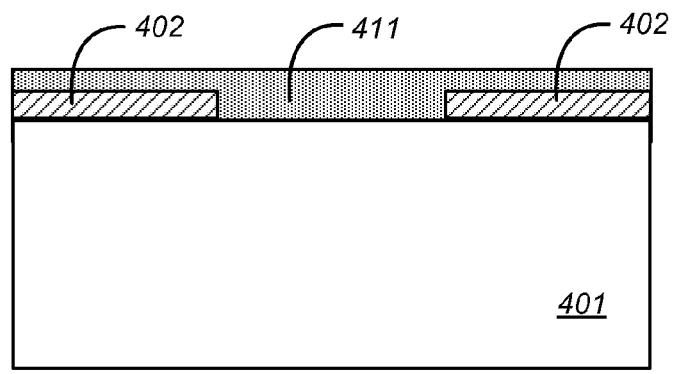
FIGS. 4A-4C are simplified schematic diagrams illustrating a process flow for formation of a diffused lateral p-n junction according to an embodiment of the present invention.
Figure 4B:
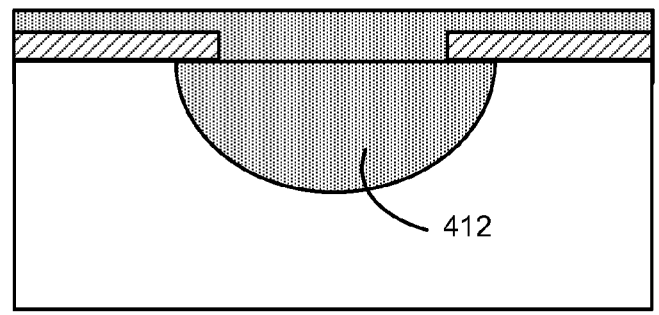
Figure 4C:
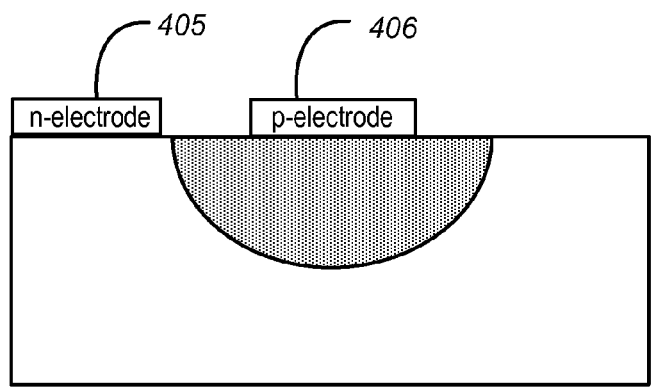

FIGS. 4A-4C are simplified schematic diagrams illustrating a process flow for formation of a diffused lateral p-n junction according to an embodiment of the present invention.

Referring to FIG. 4A, a substrate 401 is provided and a diffusion mask 402 is formed over a portion of the surface of the substrate. The mask 402 will act as a diffusion mask. Examples of masking layers suitable for use with embodiments of the present invention are silicon nitride, silicon oxide, refractory metals, or other suitable material that is able to withstand a high temperature diffusion process. A dopant source is formed as a solid source 411 in contact with a surface of the substrate 401 over which an opening is formed in the masking layer, typically using a patterning process. In the illustrated embodiment, the dopant source is separated from portions of the substrate using diffusion mask 402. In other embodiments, the diffusion source is patterned to provide a solid diffusion source with a predetermined spatial pattern, for example, by patterning a solid zinc-containing diffusion source film or a film that is a source of other donors or acceptors.

The dopant (e.g., zinc) may be diffused in-situ or ex-situ from a solid source such as a zinc-containing source deposited on the surface of the substrate. Examples of solid sources include Zn itself, zinc oxide, or the like. Using these embodiments, a lateral p-n junction is formed by selective zinc diffusion using a solid source.

A diffusion process is used to drive the material from the diffuse source into the bulk of the substrate 401 as illustrated by diffusion region 412 in FIG. 4B. In the illustrated embodiment, a p-type dopant diffuses into an n-type region to form a p-type diffusion region. In the illustrated embodiment, the diffusion region is formed in the shape of a hemisphere but this is not required by embodiments of the present invention and other structural shapes can be realized. After the diffusion mask and the diffusion source are removed, a metal electrode is formed to contact the substrate 401 (e.g., an n-type GaN substrate) and a metal electrode is formed to contact to the diffusion region 412 (e.g., a p-type GaN region). Utilizing the process illustrated in FIGS. 4A-4C, a lateral p-n junction is formed without regrowth, providing an alternative to the process and structure illustrated in FIGS. 3A-3D.

The inventors have determined that a number of acceptor species are suitable for diffusion in GaN including Mg, C, and Zn. Of these acceptor species, zinc is likely the fastest diffuser and zinc diffusion has been observed for growth of GaN on ZnO substrates and shallow zinc diffusions have been performed for improving ohmic contacts. Based on these observations and the strong visible emission from Si+Zn (donor+acceptor) codoped LEDs, the inventors have determined that zinc is an active deep acceptor, making zinc diffusion a viable process for formation of p-n junctions in III-nitride material systems including GaN-based systems.

In the embodiment illustrated in FIGS. 4A-4E, diffusion is performed on a planar surface of substrate 401 to a sufficient depth to make a lateral p-n junction. In alternative embodiments, the solid-source diffusion may also be performed on a masked and trenched sample using a suitable dopant-containing film such as ZnO deposited conformally over the contoured surface. One of ordinary skill in the art would recognize many variations, modifications, and alternatives.

Figure 4D:
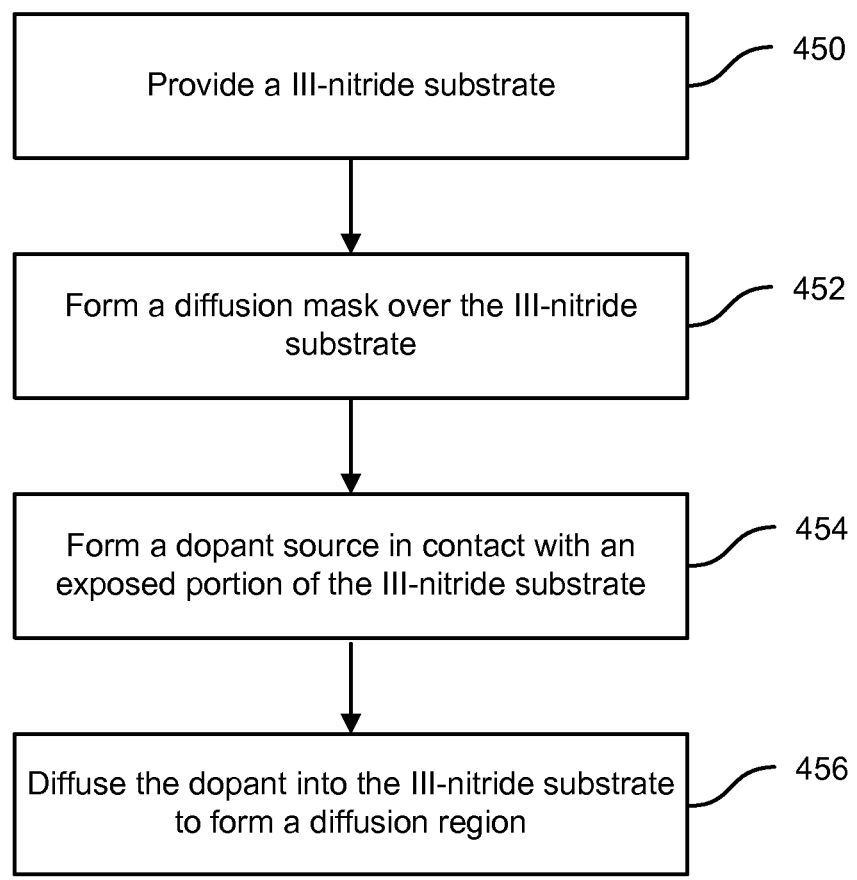
FIG. 4D is a simplified flowchart illustrating a method of fabricating a diffused p-n junction according to an embodiment of the present invention.

FIG. 4D is a simplified flowchart illustrating a method of fabricating a diffused p-n junction according to an embodiment of the present invention. The method includes providing a III-nitride substrate having a first conductivity type (450) and forming a diffusion mask over a predetermined portion of the III-nitride substrate (452). The III-nitride substrate can be an n-type GaN substrate with one or more epitaxial layers formed thereon. The diffusion mask can be one of several materials suitable for high temperature processing. The method also includes forming a dopant source (e.g., including a dopant) in contact with at least an exposed portion of the III-nitride substrate (454). The dopant source can be capped with one or more layers of material to facilitate the diffusion process of the dopant into the substrate, for example, the diffusion of zinc into an n-type GaN substrate. The method further includes diffusing the donor into the III-nitride substrate to form a diffusion region having a second conductivity type different from the first conductivity type (456). In an embodiment, the process illustrated in FIG. 4E provides a p-n junction between the III-nitride substrate and the diffusion region with a spatial orientation that is substantially orthogonal to a growth direction of the III-nitride substrate.

It should be appreciated that the specific steps illustrated in FIG. 4D provide a particular method of fabricating a diffused p-n junction according to an embodiment of the present invention. Other sequences of steps may also be performed according to alternative embodiments. For example, alternative embodiments of the present invention may perform the steps outlined above in a different order. Moreover, the individual steps illustrated in FIG. 4D may include multiple sub-steps that may be performed in various sequences as appropriate to the individual step. Furthermore, additional steps may be added or removed depending on the particular applications. One of ordinary skill in the art would recognize many variations, modifications, and alternatives.

According to other embodiments of the present invention, the junction I-V characteristic may be improved by performing an in-situ etch and clean before regrowth. As described more fully below, the damaged and contaminated region of the device is removed, allowing the subsequent regrowth to be performed on a high quality and clean surface. Consequently the p-n junction formed at this interface will be of higher structural quality and chemical purity. Embodiments of the present invention provide p-n junctions with a diode I-V characteristic that is characterized by reduced leakage in comparison with conventional devices.

FIGS. 5A-5D are simplified schematic diagrams illustrating a process flow for formation of a lateral p-n junction according to another embodiment of the present invention. Referring to FIGS. 5A-5D, a process for forming improved a lateral p-n junction using an in-situ etch/clean and regrowth is illustrated as well as the resulting device. An n-type III-nitride substrate (e.g., a GaN substrate) 501 is provided and a masking layer 502 is formed, typically through deposition and patterning. The masking layer 502 will act as both an etch and regrowth mask in this embodiment, but additional masking layers can be utilized as will be evident to one of skill in the art. A recessed region 503 (e.g., a trench) is etched into the substrate 501 using an ex-situ etch process.

Figure 5A:
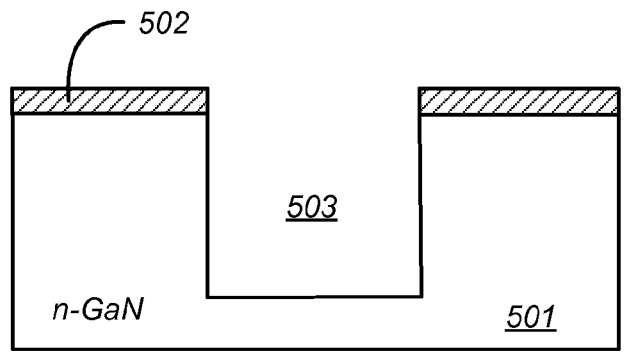
FIGS. 5A-5D are simplified schematic diagrams illustrating a process flow for formation of a lateral p-n junction according to another embodiment of the present invention.
Figure 5B:
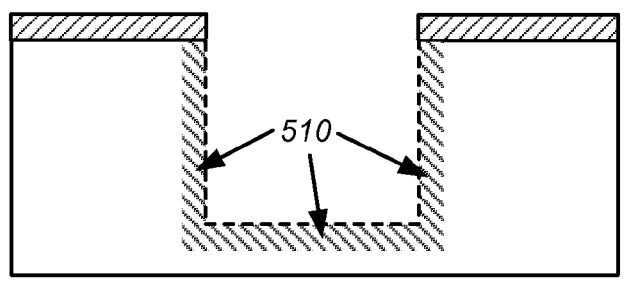

FIG. 5B illustrates an in-situ etch process that is used to remove the material illustrated with cross-hatching 510 (oriented to the left of vertical) to improve the surface quality prior to the regrowth process. Thus, after the in-situ etch process, the material illustrated with cross-hatching 510 is removed, exposing a pristine surface for subsequent regrowth. Some undercutting of the etch mask 502 is illustrated in FIG. 5B and such undercutting will depend on the particular etch process utilized. One of ordinary skill in the art would recognize many variations, modifications, and alternatives. In some embodiments, the additional widening of the etched cavity formed during the in-situ etch ranges from a few Angstroms to about 5,000 Å.

The amount of material removed during the in-situ etch process is selected to remove damage caused during the ex-situ etch process so that the depletion region formed by the p-n junction is separated from such damage. The increase in width of the etched cavity during the in-situ etch process will be a function of the particular ex-situ etch processes utilized, with ex-situ etch processes characterized by greater damage penetration values being associated with wider in-situ etch processes.

Figure 5C:
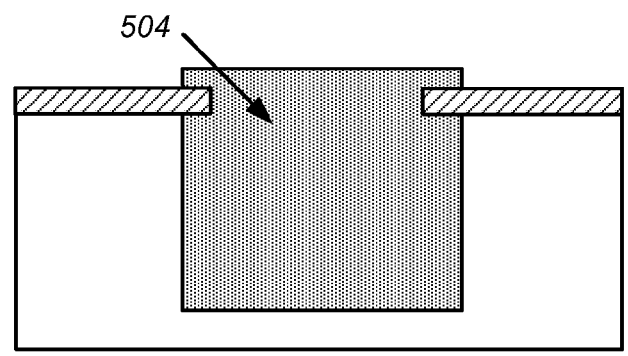
Figure 5D:
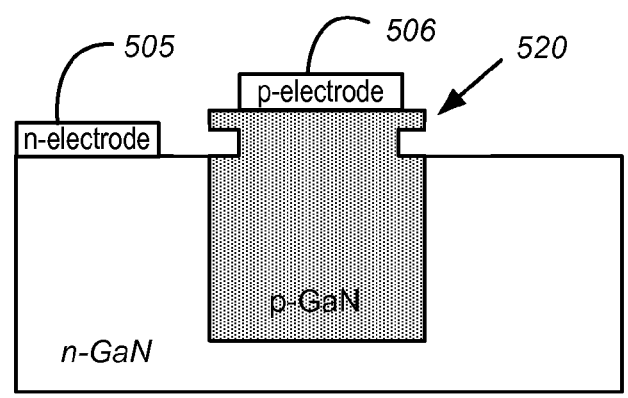

After the in-situ etch, a material with a conductivity type different from the substrate 501 is regrown, illustrated in FIG. 5C as selectively-grown p-type GaN region 504. After the etch/regrowth mask 502 is removed, a metal electrode 505 is formed to contact the substrate 501 (e.g., an n-type GaN substrate) and a metal electrode 506 can be formed to contact to the regrown region 504 (e.g., a p-type GaN region) as illustrated in FIG. 5D. Thus, embodiments of the present invention provide a lateral p-n junction structure with regrown p-type GaN that is regrown on an in-situ etched surface.

Referring to FIGS. 5C and 5D, the masking layer utilized during the etch and regrowth process produces lateral extensions 520 where the regrown material has grown up past the regrowth mask and then laterally. Additionally, the in-situ etch produces some undercutting under the mask. Thus, the lateral extensions can be detected after fabrication to indicate that an in-situ etch has been used prior to the regrowth process. According to some embodiments, the p-n junction is formed at a location defined by the termination of the in-situ etch and the use of the in-situ etch can be determined by the lateral extensions that will be produced as a result of the in-situ etch process.

Figure 5E:
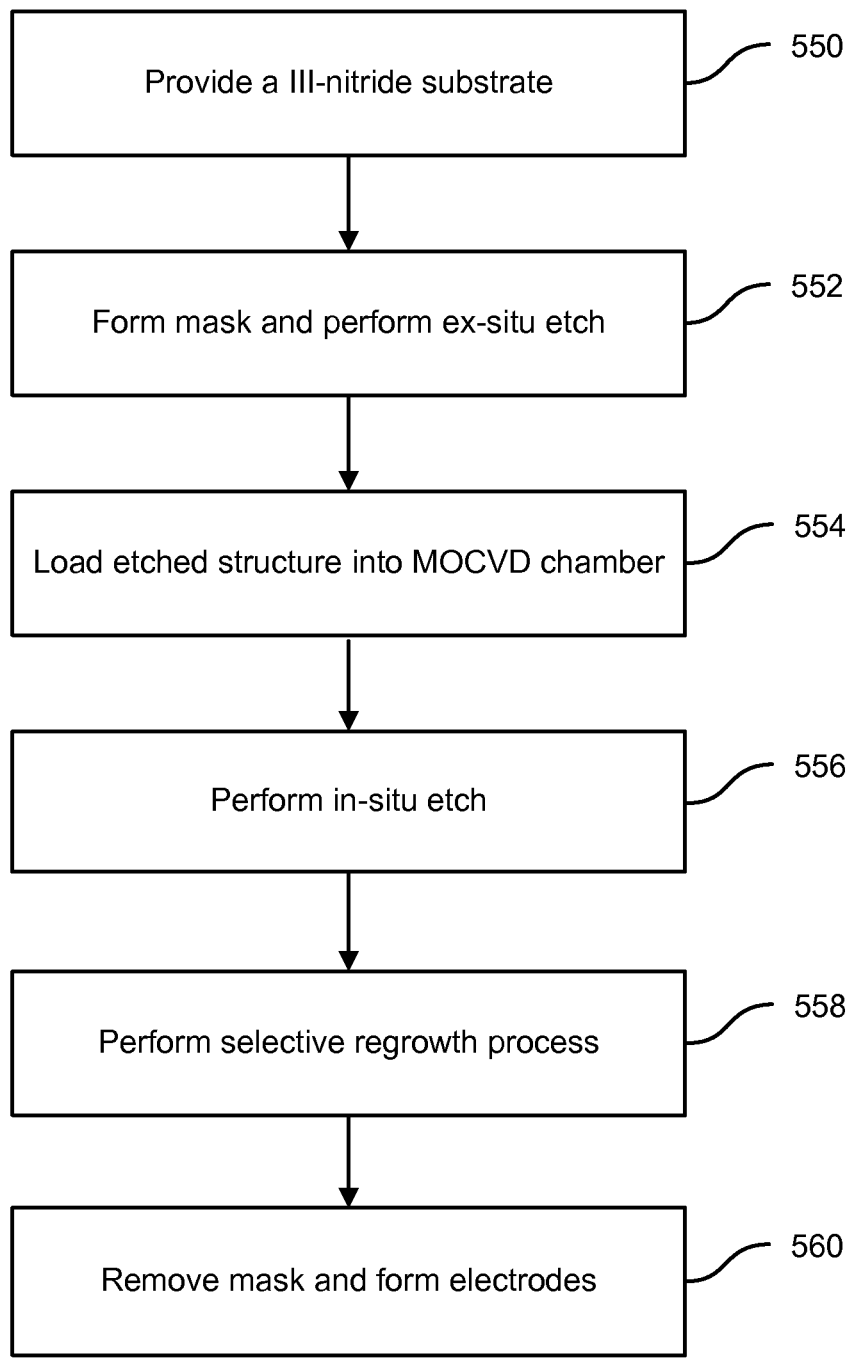
FIG. 5E is a simplified flowchart illustrating a method of fabricating a p-n junction using an in-situ etch and regrowth process according to an embodiment of the present invention.

FIG. 5E is a simplified flowchart illustrating a method of fabricating a p-n junction using an in-situ etch and regrowth process according to an embodiment of the present invention. The process illustrated in FIG. 5E provides a device with reduced leakage current in comparison with a conventionally regrown lateral p-n junction. A III-nitride substrate (e.g., a n-type GaN-based substrate such as InGaN, AlGaN, InGaAlN, or the like) is provided (550) and a mask is formed over a portion of the surface of the substrate (552). The mask will act as both an etch mask and a regrowth mask. An ex-situ etch process is performed to form a recessed region (552). The substrate with the etched region is then loaded into an MOCVD reactor or chamber (554). In the MOCVD reactor, the sample undergoes an in-situ etch (556). In an embodiment, the in-situ etch extends the width of the etched region to an extent sufficient to remove substantially all structurally-damaged material and any chemical contamination produced by the ex-situ etch process. In some embodiments, the amount of material removed during the in-situ etch ranges from about 1 nm to about 1 µm.

The in-situ etch may be accomplished in one of several manners such as by $H_2$ etching, by using a corrosive chemical such as HCl or $Cl_2$ gas flowing into the MOCVD chamber. The use of $H_2$ etching is readily implemented since $H_2$ is typically available in the MOCVD reactor. By proper adjustment of the gas variables, including the $H_2$, $N_2$, and/or $NH_3$ flows, pressure, and temperature, the etch rate may be controlled. In an alternative embodiment using regrowth of material by hydride vapor phase epitaxy (VPE), the in-situ etch can be performed with $Cl_2$ or HCl. According to embodiments of the present invention, the in-situ etching exposes a pristine crystal structure/surface, with no opportunity for contamination by air exposure.

Since the structural damage, chemical contamination, combinations thereof, or the like are reduced or eliminated during the in-situ etch step, the p-n junction quality is comparable to that of a near-ideal p-n junction formed by a continuous growth process. In other embodiments, the subsequent regrowth processes are performed on the in-situ etched surfaces, providing a higher material quality than available using ex-situ etched surfaces. Thus, the I-V characteristic of a p-n junction grown using the process illustrated in FIG. 5E will exhibit less leakage current than for a conventionally-grown junction without the use of an in-situ etch.

After the in-situ etch process, material (e.g., p-type GaN) is selectively regrown in the recessed region (558). The etch/regrowth mask is removed and electrodes can be formed (560), for example, a metal electrode to contact the substrate (e.g., the n-type GaN substrate) and a metal electrode to contact to the regrown region (e.g., the p-type GaN region).

It should be appreciated that the specific steps illustrated in FIG. 5E provide a particular method of fabricating a p-n junction using an in-situ etch and regrowth process according to an embodiment of the present invention. Other sequences of steps may also be performed according to alternative embodiments. For example, alternative embodiments of the present invention may perform the steps outlined above in a different order. Moreover, the individual steps illustrated in FIG. 5E may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6A:
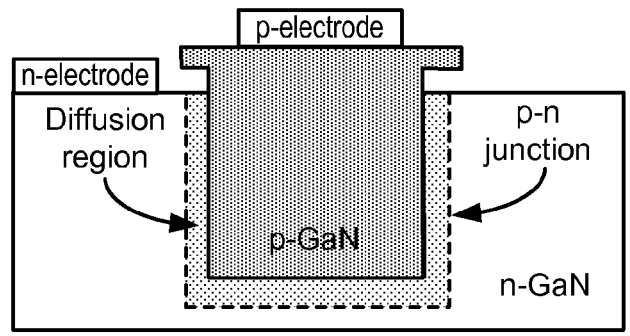
FIG. 6A is a simplified schematic diagram illustrating a lateral p-n junction displaced from a regrowth interface with a T-shaped regrowth profile according to an embodiment of the present invention.

FIG. 6A is a simplified schematic diagram illustrating a lateral p-n junction displaced from a regrowth interface with a T-shaped regrowth profile according to an embodiment of the present invention. As illustrated in FIG. 6A, the regrown material illustrated as p-GaN material, has a T-shaped regrowth profile at a location above the regrowth mask at which the regrown material grew laterally. The diffusion of acceptors into the n-GaN substrate material produced a displacement of the p-n junction laterally with respect to the regrowth interface indicated by the periphery of the regrown material. Thus, in this embodiment, the regrowth profile below the regrowth mask is characterized by straight edges extending into the substrate.

Figure 6B:
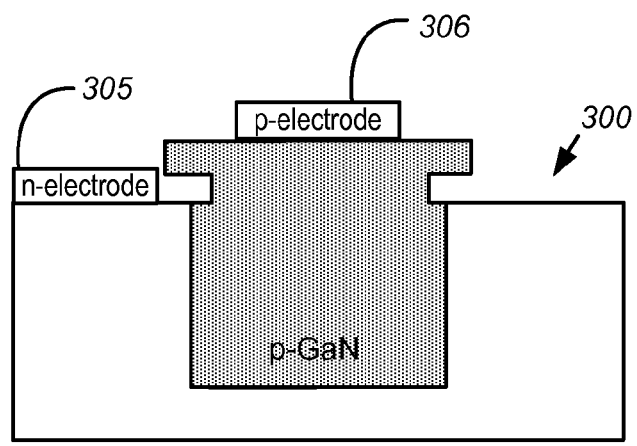
FIG. 6B is a simplified schematic diagram illustrating a lateral p-n junction with a T-shaped regrowth profile according to another embodiment of the present invention.

FIG. 6B is a simplified schematic diagram illustrating a lateral p-n junction with a T-shaped regrowth profile according to another embodiment of the present invention. As illustrated in FIG. 6B, the regrown material illustrated as p-GaN material, has a T-shaped regrowth profile at a location above the regrowth mask at which the regrown material grew laterally in a manner similar to FIG. 6A. For the embodiment illustrated in FIG. 6B, an in-situ etch process was utilized prior to regrowth, producing undercutting under the etch mask and a regrowth profile that extends laterally in the substrate region to a width greater than the width of the opening in the regrowth mask.

Figure 6C:
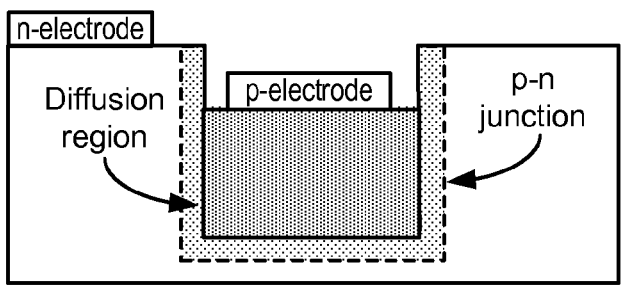
FIG. 6C is a simplified schematic diagram illustrating a lateral p-n junction displaced from a regrowth interface with an underfilled regrowth profile according to an embodiment of the present invention.

FIG. 6C is a simplified schematic diagram illustrating a lateral p-n junction displaced from a regrowth interface with an underfilled regrowth profile according to an embodiment of the present invention. As illustrated in FIG. 6C, regrowth after a diffusion process can result in underfilling of the recessed region. The lateral displacement of the p-n junction from the regrowth interface can be used to indicate the use of a diffusion process to form the laterally displaced p-n junction.

Embodiments of the present invention provide benefits not available using conventional techniques since the p-n junction can be present in bulk material at a location displaced from growth and/or regrowth interfaces. In some embodiments, a GaN bulk region is provided and a portion of the GaN bulk region is removed, for example, using an etching process to form a remaining portion of the GaN bulk region. In examples using etching, an etch interface is formed at the periphery of the remaining portion of the GaN bulk region. The etch interface is characterized by a first density of structural defects per unit area.

The p-n junction is formed at a location between the etch interface and the GaN bulk region as illustrated by the embodiments described herein. The p-n junction is characterized by a second density of structural defects per unit area less than the first density. Thus, by displacing the p-n junction into the bulk, the quality of material in the vicinity of the p-n junction is improved in comparison with conventional structures, thereby improving electrical device performance. In addition to structural defect densities, the etch interface and the p-n junction can have chemical defect densities associated therewith. According to some embodiments of the present invention, the chemical defect density of the p-n junction is less than the chemical defect density of the etch interface. The higher purity of the material at the p-n junction interface improves electrical performance as well as other device properties. In embodiments in which regrowth processes are utilized, the etch interface can also be a regrowth interface that is spatially separated from the p-n junction by a predetermined distance in contrast with conventional devices in which they would be coincidental.

Referring once again to FIG. 3C, the depth of the diffusion of the dopant into the material is selected to provide a distance between the etch/regrowth interface and the p-n junction greater than the depletion width of the p-n junction. Thus, surfaces characterized by poorer electrical characteristics are located outside the depletion region of the p-n junction. As an example, zinc can be diffused into GaN to a depth ranging from about 50 Å to about 1,000 Å, for example, 500 Å. As will be evident to one of skill in the art, the depletion region width will depend on the doping levels of the donors and acceptors, thereby modifying the particular exemplary distances discussed above. Thus, embodiments of the present invention are not limited by the exemplary distances discussed above.

Embodiments of the present invention are applicable to devices including vertical junction FETs (JFETs), which can utilize lateral p-n junctions to change the depletion region width across a channel, but embodiments of the present invention are not limited to these device architectures and are also applicable to any structure including lateral p-n junctions, junction barrier Schottky diodes, or devices with regrown channels. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a lateral p-n junction in III-nitride materials, the method comprising:
   providing an n-type III-nitride substrate;
   forming an n-type epitaxial layer coupled to the n-type III-nitride substrate;
   forming an etch/regrowth mask coupled to a surface of the n-type III-nitride substrate;
   removing at least a portion of the n-type epitaxial layer to define a recessed region;
   diffusing an acceptor into the recessed region to form a doped region extending from the recessed region into the substrate, wherein the doped region of the substrate and the substrate adjacent to the doped region collectively form a p-n junction spaced apart from the recessed region and extending along an entire depth of the recessed region;
   loading the substrate into an MOCVD reactor;
   removing a portion of the doped region using an in-situ etch process to undercut the etch/regrowth mask; and
   regrowing a p-type epitaxial layer coupled to the doped region, wherein the surface of the n-type III-nitride substrate is free from the regrown p-type epitaxial layer.

2. The method of claim 1 wherein:
   a regrowth interface is defined by the p-type epitaxial layer and the recessed region; and
   the p-n junction is spaced apart from the regrowth interface.

3. The method of claim 2 wherein the p-n junction is spaced apart from the regrowth interface by a distance between about 1 nm and about 1 μm.

4. The method of claim 1 wherein the p-n junction is spaced has a depth into the substrate between about 1 nm and about 1 μm.

5. The method of claim 1 wherein the acceptor comprises zinc.

6. The method of claim 1 wherein the acceptor comprises at least one of magnesium, beryllium, or calcium.

7. The method of claim 1 wherein the n-type III-nitride substrate comprises a GaN substrate doped with at least one of silicon or oxygen.

8. The method of claim 1 wherein the p-n junction extends in a direction substantially orthogonal to a growth direction of the III-nitride material having the second conductivity type.

9. A method of forming a lateral p-n junction, the method comprising:
   providing a substrate comprising a GaN-based material characterized by a first conductivity type;
   forming an etch/regrowth masking layer on a surface of the substrate;
   removing a first portion of the substrate using an ex-situ etch process, whereby an etched surface defined by the etch/regrowth masking layer is exposed;
   loading the substrate with the etched surface into an MOCVD reactor;
   removing an additional portion of the substrate from the etched surface using an in-situ etch process in the MOCVD reactor to undercut the etch/regrowth mask, wherein removing the first and additional portions forms a recessed region in the substrate; and
   regrowing a GaN-based material characterized by a second conductivity type in at least a portion of the first portion and the additional portion, wherein the surface of the substrate is free from the regrown GaN-based materials.

10. The method of claim 9, wherein the substrate comprises a GaN substrate.

11. The method of claim 9, wherein the first conductivity type comprises an n-type.

12. The method of claim 11, wherein the second conductivity type comprises a p-type.

13. The method of claim 9, further comprising:
   forming an electrode on a portion of the substrate to provide an electrical connection to the GaN-based material of the first conductivity type; and
   forming a second electrode on a portion of the epitaxial layer of the second conductivity type.

14. The method of claim 9, wherein a width of the first portion is less than a width of the additional portion.

15. The method of claim 9 further comprising, after regrowing the GaN-based material, removing the etch/regrowth masking layer.

\* \* \* \* \*